(12) United States Patent
Suehiro et al.

(10) Patent No.: US 9,966,332 B2
(45) Date of Patent: May 8, 2018

(54) SOLID-STATE DEVICE INCLUDING A CONDUCTIVE BUMP CONNECTED TO A METAL PATTERN AND METHOD OF MANUFACTURING THE SAME

(71) Applicant: Toyoda Gosei Co., Ltd., Kiyosu-shi, Aichi-ken (JP)

(72) Inventors: Yoshinobu Suehiro, Kiyosu (JP); Satoshi Wada, Kiyosu (JP); Koji Tasumi, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days. days.

(21) Appl. No.: 13/794,576

(22) Filed: Mar. 11, 2013

(65) Prior Publication Data

US 2013/0248916 A1 Sep. 26, 2013

(30) Foreign Application Priority Data

Mar. 22, 2012 (JP) .................................. 2012-066289
Dec. 18, 2012 (JP) .................................. 2012-275997

(51) Int. Cl.
*H01L 23/498* (2006.01)
*H01L 23/00* (2006.01)
(Continued)

(52) U.S. Cl.
CPC .. *H01L 23/49827* (2013.01); *H01L 23/49838* (2013.01); *H01L 24/16* (2013.01);
(Continued)

(58) Field of Classification Search
CPC ............ H01L 21/4825; H01L 21/4835; H01L 23/3128; H01L 24/81; H01L 24/10;
(Continued)

(56) References Cited

U.S. PATENT DOCUMENTS 6,531,328 B1* 3/2003 Chen ............................... 438/26
7,166,483 B2* 1/2007 Liu et al. ......................... 438/29
(Continued)

FOREIGN PATENT DOCUMENTS

JP 02-249248 A 10/1990
JP H 05-090330 A 4/1993
(Continued)

OTHER PUBLICATIONS

Japanese Office Action dated Jan. 12, 2016 with a partial English translation.
(Continued)

*Primary Examiner* — Marcos D Pizarro
(74) *Attorney, Agent, or Firm* — McGinn IP Law Group, PLLC.

(57) ABSTRACT

A solid-state device includes a metal pattern formed on a substrate, a conductive bump connected to the metal pattern so as to be contact with a side surface of the metal pattern, and a solid-state element connected to the metal pattern via the conductive bump. A bottom surface level of at least a portion of the conductive bump is substantially equal to a bottom surface level of a portion of the metal pattern at which the metal pattern is connected to the conductive bump.

5 Claims, 17 Drawing Sheets

(51) Int. Cl.
 H01L 29/06 (2006.01)
 H05K 1/11 (2006.01)
 H05K 3/32 (2006.01)
 H01L 33/62 (2010.01)

(52) U.S. Cl.
 CPC .............. *H01L 24/17* (2013.01); *H01L 24/32* (2013.01); *H01L 24/73* (2013.01); *H01L 29/0657* (2013.01); *H01L 33/62* (2013.01); *H05K 1/111* (2013.01); *H05K 3/325* (2013.01); *H01L 24/05* (2013.01); *H01L 24/06* (2013.01); *H01L 24/13* (2013.01); *H01L 24/48* (2013.01); *H01L 2224/0401* (2013.01); *H01L 2224/04042* (2013.01); *H01L 2224/05568* (2013.01); *H01L 2224/05599* (2013.01); *H01L 2224/0603* (2013.01); *H01L 2224/06102* (2013.01); *H01L 2224/13023* (2013.01); *H01L 2224/1329* (2013.01); *H01L 2224/13139* (2013.01); *H01L 2224/13144* (2013.01); *H01L 2224/13147* (2013.01); *H01L 2224/13386* (2013.01); *H01L 2224/1415* (2013.01); *H01L 2224/16105* (2013.01); *H01L 2224/16237* (2013.01); *H01L 2224/17051* (2013.01); *H01L 2224/17106* (2013.01); *H01L 2224/17505* (2013.01); *H01L 2224/26175* (2013.01); *H01L 2224/29139* (2013.01); *H01L 2224/29144* (2013.01); *H01L 2224/29147* (2013.01); *H01L 2224/32105* (2013.01); *H01L 2224/48091* (2013.01); *H01L 2224/48465* (2013.01); *H01L 2224/73203* (2013.01); *H01L 2224/73265* (2013.01); *H01L 2224/8114* (2013.01); *H01L 2224/81191* (2013.01); *H01L 2224/81385* (2013.01); *H01L 2224/81439* (2013.01); *H01L 2224/81444* (2013.01); *H01L 2224/83192* (2013.01); *H01L 2224/83385* (2013.01); *H01L 2224/85385* (2013.01); *H01L 2924/00013* (2013.01); *H01L 2924/00014* (2013.01); *H01L 2924/10155* (2013.01); *H01L 2924/351* (2013.01); *H05K 2201/098* (2013.01); *H05K 2201/0969* (2013.01); *H05K 2201/09381* (2013.01); *H05K 2201/09827* (2013.01); *H05K 2201/10106* (2013.01); *Y02P 70/611* (2015.11)

(58) Field of Classification Search
 CPC .............. H01L 23/488; H01L 23/49811; H01L 23/49827; H01L 23/49838; H01L 24/73; H01L 24/16; H01L 24/17; H01L 24/32; H01L 29/0657; H01L 33/62; H05K 1/11; H05K 3/325
 USPC .......................................... 257/738
 See application file for complete search history.

(56) References Cited

U.S. PATENT DOCUMENTS

| 2007/0126126 | A1 | 6/2007 | Kim et al. | |
| 2008/0310854 | A1* | 12/2008 | Takai | G02B 6/423 398/139 |
| 2010/0176510 | A1* | 7/2010 | Pendse | 257/737 |
| 2011/0084386 | A1* | 4/2011 | Pendse | 257/737 |
| 2011/0101393 | A1* | 5/2011 | Hsu et al. | 257/98 |

FOREIGN PATENT DOCUMENTS

| JP | H 06-349891 A | 12/1994 |
| JP | H 07-321438 A | 12/1995 |
| JP | H 11-330157 A | 11/1999 |
| JP | 2008-053423 A | 3/2008 |
| JP | 2008-091692 A | 4/2008 |
| JP | 2010-278139 A | 12/2010 |
| JP | 2011-222875 A | 11/2011 |

OTHER PUBLICATIONS

Japanese Decision of Refusal dated Aug. 30, 2016 and Partial English translation thereof.

* cited by examiner

18 METAL PATTERN

SOLID-STATE DEVICE INCLUDING A CONDUCTIVE BUMP CONNECTED TO A METAL PATTERN AND METHOD OF MANUFACTURING THE SAME

The present application is based on Japanese patent application Nos. 2012-066289 and 2012-275997 filed on Mar. 22, 2012 and Dec. 18, 2012, respectively, the entire contents of which are incorporated herein by reference.

BACKGROUND OF THE INVENTION

1. Field of the Invention

The invention relates to a solid-state device and a method of manufacturing the solid-state device.

2. Related Art

Conventional solid-state devices include a device that a solid-state element such as LED chip is connected to a metal pattern via a conductive bump (see, e.g., JP-A-2011-222875).

SUMMARY OF THE INVENTION

The device disclosed in JP-A-2011-222875 is constructed such that the conductive bump is formed on a connecting terminal as a metal pattern on a substrate and an LED element is formed on the bump. Therefore, the LED element is spaced from the substrate by the height of the metal pattern and the conductive bump, which may cause a decrease in heat dissipation.

Accordingly, it is an object of the invention to provide a solid-state device that is excellent in heat dissipation while carrying a solid-state element connected to a metal pattern via a conductive bump, and a method of manufacturing the solid-state device.

(1) According to one embodiment of the invention, a solid-state device comprises:

a metal pattern formed on a substrate;
a conductive bump connected to the metal pattern so as to be contact with a side surface of the metal pattern; and
a solid-state element connected to the metal pattern via the conductive bump,
wherein a bottom surface level of at least a portion of the conductive bump is substantially equal to a bottom surface level of a portion of the metal pattern at which the metal pattern is connected to the conductive bump.

In the above embodiment (1) of the invention, the following modifications and changes can be made.

(i) An end portion of the metal pattern comprises a recessed portion, and wherein at least the portion of the conductive bump is formed in the recessed portion.

(ii) The side surface of the metal pattern is inclined with respect to a vertical direction.

(iii) An end portion of the metal pattern has a triangular shape, and wherein the conductive bump is formed on a tip of the triangular shape.

(iv) In a region under the solid-state device, a distance between the conductive bumps is smaller than a distance between the metal patterns connected to the conductive bumps.

(v) An end portion of the metal pattern comprises a hole, and wherein the conductive bump is formed in the hole.

(vi) The solid-state element is a light-emitting element.

(vii) The metal pattern comprises first and second metal patterns, wherein the conductive bump comprises first and second conductive bumps, and wherein two electrodes of the solid-state element are each connected to the first and second metal patterns via the first and second conductive bumps.

(viii) One electrode of the solid-state element is connected to the metal pattern via the conductive bump and another electrode is connected to another metal pattern via a wire.

(2) According to another embodiment of the invention, a method of manufacturing a solid-state device comprises:

forming a conductive bump on a substrate at a distance from a metal pattern and; mounting a solid-state element on the substrate so as to be in contact with the conductive bump so that the conductive bump is deformed by the mounting of the solid-state element and is brought into contact with a side surface of the metal pattern.

In the above embodiment (2) of the invention, the following modifications and changes can be made.

(ix) An end portion of the metal pattern comprises a recessed portion, wherein at least a portion of the conductive bump is formed in the recessed portion, and wherein the conductive bump comes into contact with a side surface of the metal pattern in the recessed portion by the mounting of the solid-state element.

(x) The side surface of the metal pattern is inclined with respect to a vertical direction, and wherein the conductive bump comes into contact with the side surface of the metal pattern by the mounting of the solid-state element.

(xi) The metal pattern is formed by screen-printing Ag paste.

(xii) A metal island is formed on the substrate under an anode electrode of the solid-state element, and wherein the metal island is covered by the conductive bump that connects the anode electrode to the metal pattern.

(xiii) A cut-out portion is formed on the metal pattern in a region under the anode electrode of the solid-state element, and wherein a conductive bump to be connected to the anode electrode is formed in a region of the metal pattern including the cutout portion, (xiv) The solid-state element comprises a transistor comprising a source electrode and a drain electrode on lower and upper surfaces, respectively,
wherein the metal pattern to be connected to the source electrode via the conductive bump comprises a plurality of linear metal films in a region under the source electrode, and wherein a heatsink is formed on the solid-state element so as to be in contact with the drain electrode.

Points of the Invention

According to one embodiment of the invention, a solid-state device is constructed such that a metal pattern has a recessed portion at an end portion to be connected to the solid-state element and at least a portion of a conductive bump is formed in the recessed portion. Thus, the bottom surface level of the conductive bumps is equal to that of the portion of the metal pattern to which the conductive bump is connected. Thereby, the distance (i.e., length of heat conduction path) between the substrate (top surface) and the solid-state element (bottom) is less than that in the conventional solid-state device since the conductive bump is formed in the recessed portion of the metal pattern. Therefore, the solid-state device can be in heat dissipation better than the conventional solid-state device.

BRIEF DESCRIPTION OF THE DRAWINGS

Next, the present invention will be explained in more detail in conjunction with appended drawings, wherein.

DESCRIPTION OF THE PREFERRED EMBODIMENTS

First Embodiment

Structure of Solid-State Device

Figure 1:
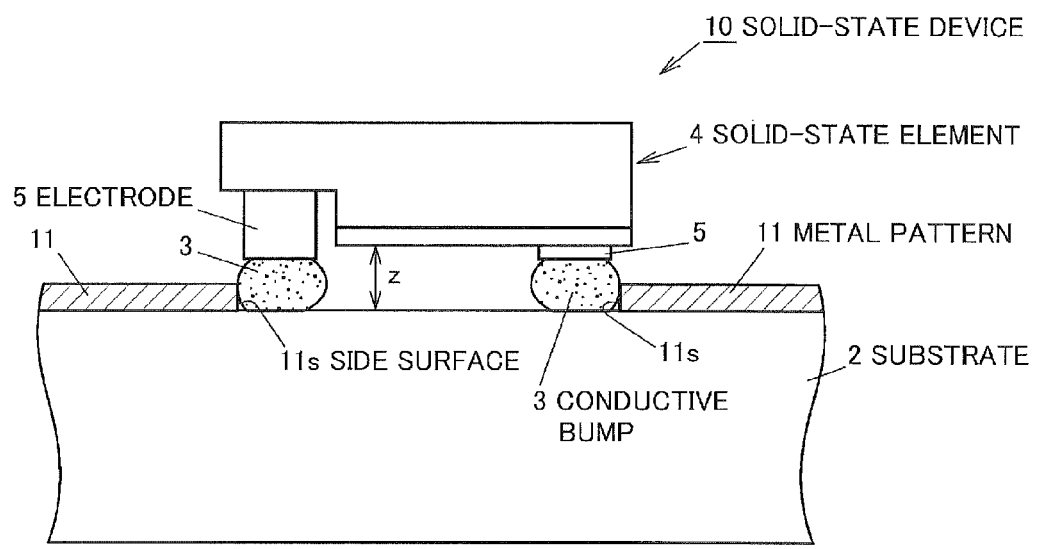
FIG. 1 is a vertical cross-sectional view showing a portion of a solid-state device in a first embodiment.

FIG. 1 is a vertical cross-sectional view showing a portion of a solid-state device in the first embodiment. A solid-state device 10 has a substrate 2, a metal pattern 11 formed on the substrate 2 and a solid-state element 4 connected to the metal pattern 11 via a conductive bump 3.

The substrate 2 is formed of, e.g., polycrystalline alumina. It is possible to use polycrystalline alumina of which strength is enhanced by adding ZrO or polycrystalline alumina of which reflectance is enhanced by adding light scattering glass. Alternatively the substrate 2 may be formed of a high thermal conductivity member having a thermal conductivity of not less than 100 W/(m·k), such as AlN or $Si_3N_4$. In addition, when a process requiring a substrate to have heat resistance, such as hot-melting of low-melting-point glass to seal the solid-state element 4, is not carried out, it is possible to use a low-heat resistant substrate such as glass-epoxy substrate, paper phenolic substrate or polyimide substrate, etc., as the substrate 2. In addition, a heat dissipation path formed of a high thermal conductivity member may be formed on the substrate 2.

The metal pattern 11 has a laminated structure composed of, e.g., Au/Ni/W, Au/Ni/Ta, Au/Ni/Cu or Au/Ni/Cr. Ag may be alternatively used instead of Au which is the front surface of these laminated structures. The metal pattern 11 is formed by, e.g., screen-printing, deposition, sputtering or plating.

The conductive bump 3 is formed of a material excellent in conductivity, such as Ag, Au or Cu. A volume resistivity the conductive bump 3 is preferably not more than $5 \times 10^{-18}$ Ω·cm. Ag which is excellent in both of conductivity and reflectance is particularly preferable as a material of the conductive bump 3. The conductive bump 3 is formed by, e.g., screen-printing or discharge using a dispenser. The conductive material constituting the conductive bump 3 treated by heat, etc., after discharge may be in the form of particles or in the form of bulk. Alternatively, it may be between the form of particles and the form of bulk.

The solid-state element 4 is, e.g., a light-emitting element such as LED chip, a light-receiving element such as light-receiving sensor or solar cell, etc., or a transistor. As an LED chip, it is possible to use, e.g., a GaN-based LED having n- and p-type GaN epitaxially grown on a sapphire substrate and a transparent p-type contact electrode provided thereon, and a GaN-based LED provided with a reflecting surface on a GaN substrate or a highly-reflective p-type contact electrode based on Ag, etc. Alternatively, another compound semiconductor such as GaAs-based semiconductor or AlInGaP-based semiconductor may be used instead of such GaN-based substrates for LED. In addition, the solid-state element 4 may be a light-emitting element or transistor of Si, SiC or GaN. The conductive bumps 3 are respectively connected to two n- and p-type electrodes 5 of the solid-state element 4.

Figure 2A:
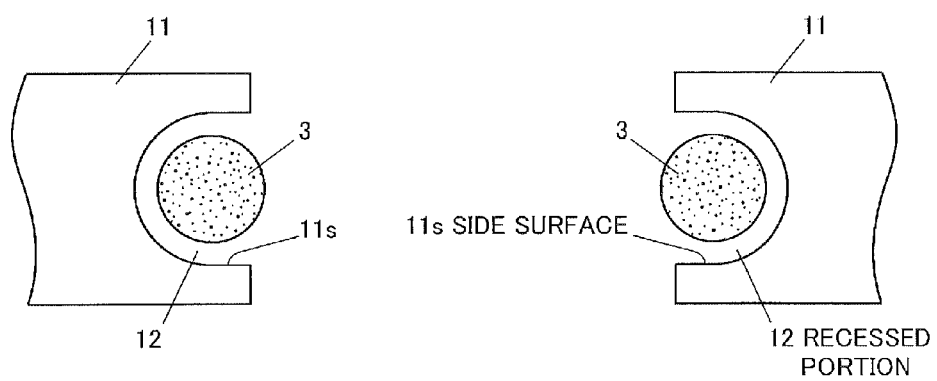
FIGS. 2A and 2B are top views respectively showing states of an end portion of a metal pattern and a conductive bump before and after mounting the solid-state device in the first embodiment.
Figure 2B:
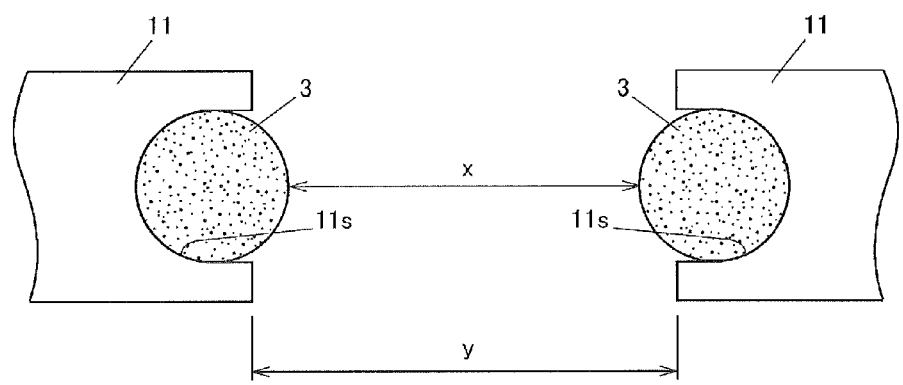

FIGS. 2A and 2B are top views respectively showing states of an end portion of the metal pattern 11 and the conductive bump 3 before and after mounting the solid-state element 4. In the first embodiment, the metal pattern 11 has a recessed portion 12 at an end portion to be connected to the solid-state element 4 and at least a portion of the conductive bump 3 is formed in the recessed portion 12. Therefore, the bottom surface level of the conductive bumps 3 is equal to that of a portion of the metal pattern 11 to which the conductive bump 3 is connected. Although the conductive bump 3 may be in contact with an upper surface of the metal pattern 11, the metal pattern 11 is not formed immediately under the horizontal center of the conductive bump 3. Note that, after the formation of the conductive bump, the upper surface of the conductive bump 3 is slightly higher than that of the metal pattern 11.

In the example shown in FIGS. 2A and 2B, the conductive bump 3, which is formed at a distance from the metal pattern 11, is initially not in contact with the metal pattern 11 before mounting the solid-state element 4, is deformed by mounting the solid-state element 4 and then comes into contact with a side surface 11s of the metal pattern 11 in the recessed portion 12. However, the conductive bump 3 may be in contact with the metal pattern 11 before mounting the solid-state element 4.

Figure 3A:
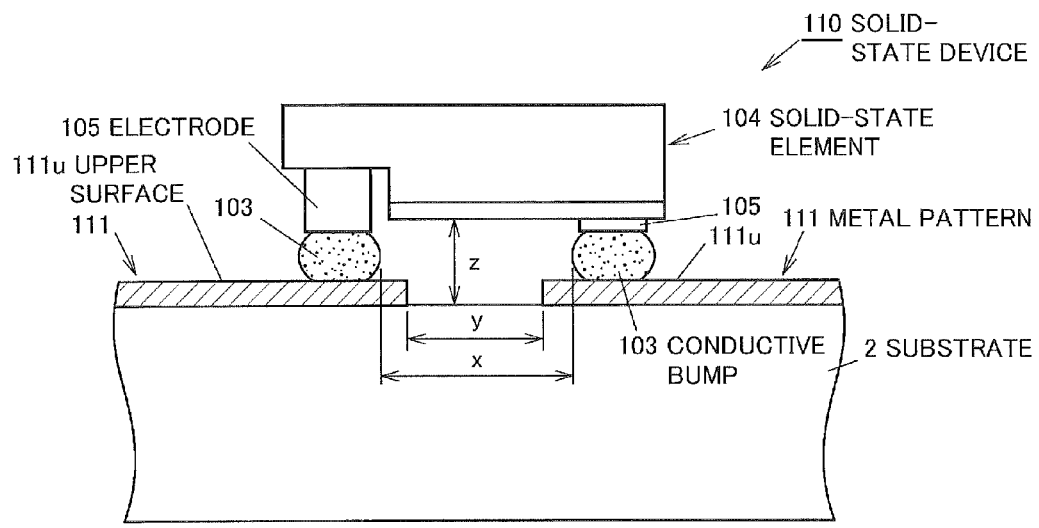
FIG. 3A is a vertical cross-sectional view showing a portion of a solid-state device in Comparative Example and FIG. 3B is a top view showing an end portion of a metal pattern and a conductive bump of the solid-state device in Comparative Example.
Figure 3B:
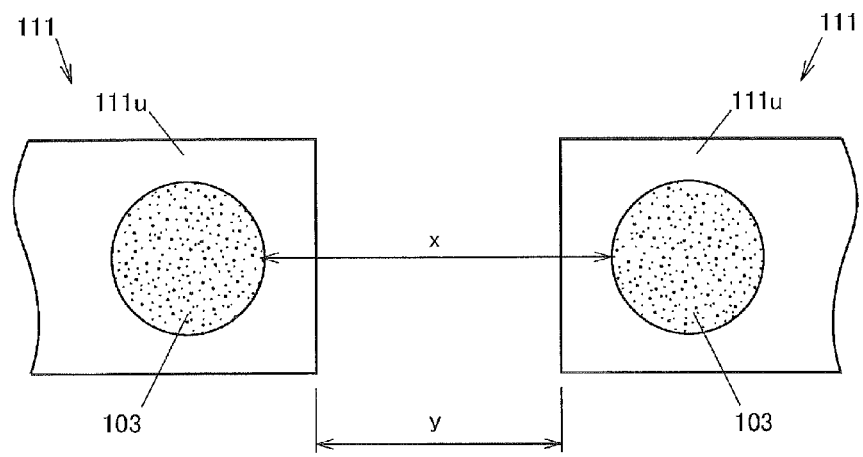

FIG. 3A is a vertical cross-sectional view showing a portion of a solid-state device 110 in Comparative Example. FIG. 3B is a top view showing an end portion of a metal pattern 111 and a conductive bump 103 of the solid-state device 110. In the solid-state device 110, the conductive bump 103 is famed on an upper surface 111u of the metal pattern 111 and a solid-state element 104 is formed thereon.

On the other hand, in the solid-state device 10 of the first embodiment, a distance z from the substrate to the solid-state element is smaller than that in the solid-state device 110 since the conductive bump 3 is formed in the recessed portion 12 of the metal pattern 11. Therefore, the solid-state device 10 in the first embodiment has better heat dissipation than the solid-state device 110 in Comparative Example. Especially when the solid-state element is sealed, a heat dissipation path through a sealing material is also formed and it is more effective if the sealing material is formed of a material having a larger thermal conductivity than a rein, such as glass. In addition, when the sealing material is formed of glass, a thermal expansion coefficient thereof is smaller than that of a resin and is close to that of the solid-state element 4, hence, thermal stress is less likely to occur during use. Furthermore, when the glass is hot-melt glass and is melted and bonded to the substrate 2, the bonding to the substrate 2 is strong. For these reasons, separation of the solid-state element 4 or electrodes is less likely to occur and it is thus possible to enhance reliability. Therefore, it is possible to ensure reliability even when the conductive bumps 3 are formed at a time by screen-printing or metal mask printing and the condition of the conductive bumps 3 varied due to time lag caused by sequentially mounting the solid-state elements 4 creates portions where the bonding strength of the solid-state element 4 is small.

In addition, in the solid-state device 10 of the first embodiment, since the conductive bump 3 is formed in the recessed portion 12 of the metal pattern 11, a space x between the conductive bumps 3 is smaller than a space y between the metal patterns 11 to which the conductive bumps 3 are connected. On the other hand, in the solid-state device 110 of Comparative Example, the space x between the conductive bumps 103 in a region under the solid-state element 104 is larger than the space y between the metal patterns 111 to which the conductive bumps 103 are connected.

In other words, in the solid-state device 10 of the first embodiment, a distance between the metal patterns can be provided so as to be larger than a distance between the electrodes of the solid-state element in contrast to the solid-state device 110 of Comparative Example. Therefore, it is not necessary to use a highly accurate method for patterning the metal pattern 11 or for inspection after the patterning, which allows the manufacturing cost to be reduced.

In addition, the area of the metal pattern immediately under the solid-state element in the solid-state device 10 of the first embodiment is smaller than that in solid-state device 110 of Comparative Example. Therefore, in case that the solid-state element is a light-emitting element, an amount of light absorbed by the metal pattern is small and light extraction efficiency is thus high.

Furthermore, in the solid-state device 10 of the first embodiment, since the conductive bump 3 is formed in the recessed portion 12 of the metal pattern 11, it is possible to suppress deformation of the conductive bump 3 in a horizontal direction at a time of mounting the solid-state element 4.

Figure 4A:
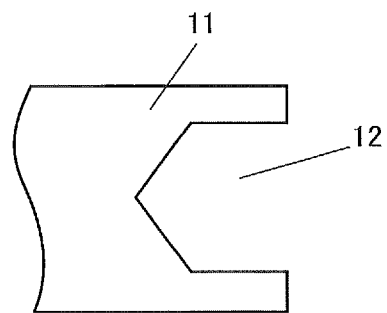
FIGS. 4A to 4C are top views showing modifications of the metal pattern in the first embodiment.
Figure 4B:
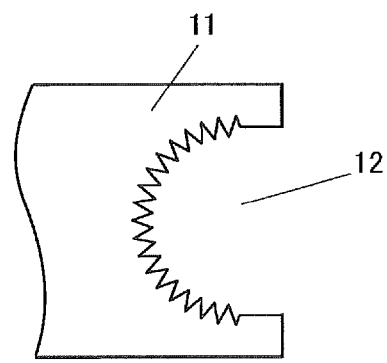
Figure 4C:
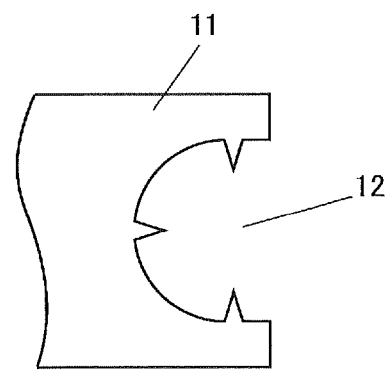

FIGS. 4A to 4C are top views showing modifications of the metal pattern 11 in the first embodiment. The recessed portions 12 of the metal pattern 11 shown in FIGS. 4A to 4C have respectively different shapes. As such, the shape of the recessed portion 12 is not limited to a semi-circular shape and may be a polygonal shape or a shape having protrusions at the edge. When the recessed portion 12 includes protrusions, it is advantageous in that the conductive bump 3 easily comes into contact with the metal pattern 11.

Figure 5A:
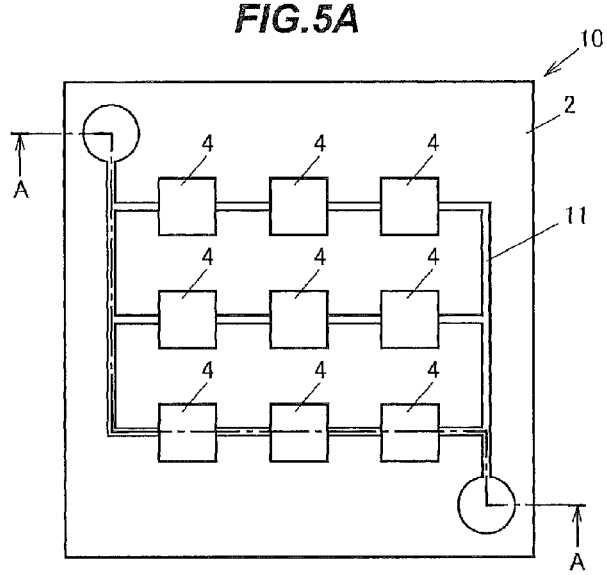
FIGS. 5A to 5C are, respectively, a top view, a bottom view and a cross sectional view showing a structural example of a solid-state device package in the first embodiment.
Figure 5B:
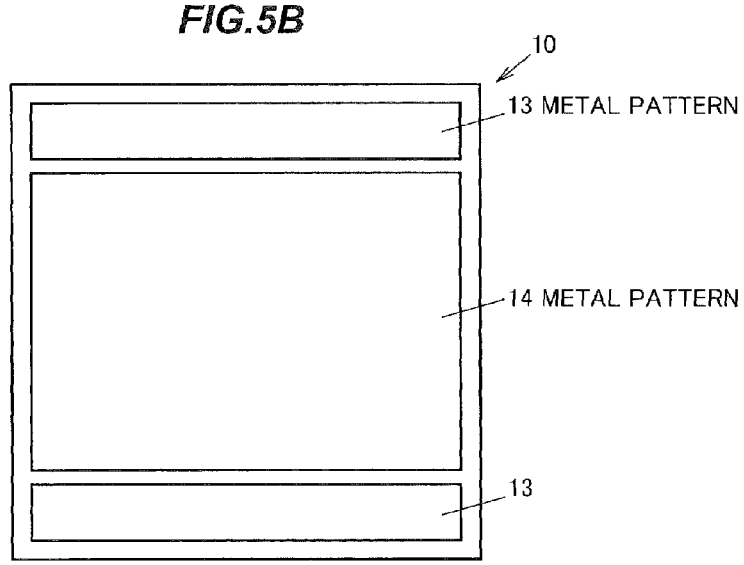
Figure 5C:
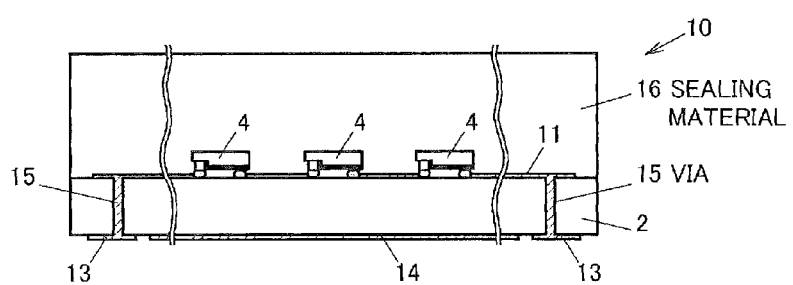

FIGS. 5A to 5C are, respectively, a top view, a bottom view and a cross sectional view showing a structural example of a package of the solid-state device 10. FIG. 5C shows a cross section taken on line A-A of FIG. 5A.

In this configuration, metal patterns 13 and 14 are formed on a back surface of the substrate 2. The metal patterns 11 and 13 are circuit patterns which are connected by a via 15. In addition, a terminal of an external device is connected to the metal pattern 13. The metal pattern 14 is a pattern for dissipating heat.

In addition, the solid-state element 4 is sealed with a light-transmissive sealing material 16. The sealing material 16 is formed of, e.g., $ZnO$—$Si_2O$—$B_2O_3$-based glass. Alternatively, low-melting-point glass with another base or resin materials such as silicon resin or epoxy resin may be used as a material of the sealing material 16. In addition, colored high thermal conductivity particles such as AN may be contained when the solid-state element 4 with emphasis on heat dissipation is not an optical element. Meanwhile, the sealing material 16 may contain phosphor particles when the solid-state element 4 is a light-emitting element. It should be noted that illustration of the sealing material 16 is omitted in FIG. 5A.

Figure 6A:
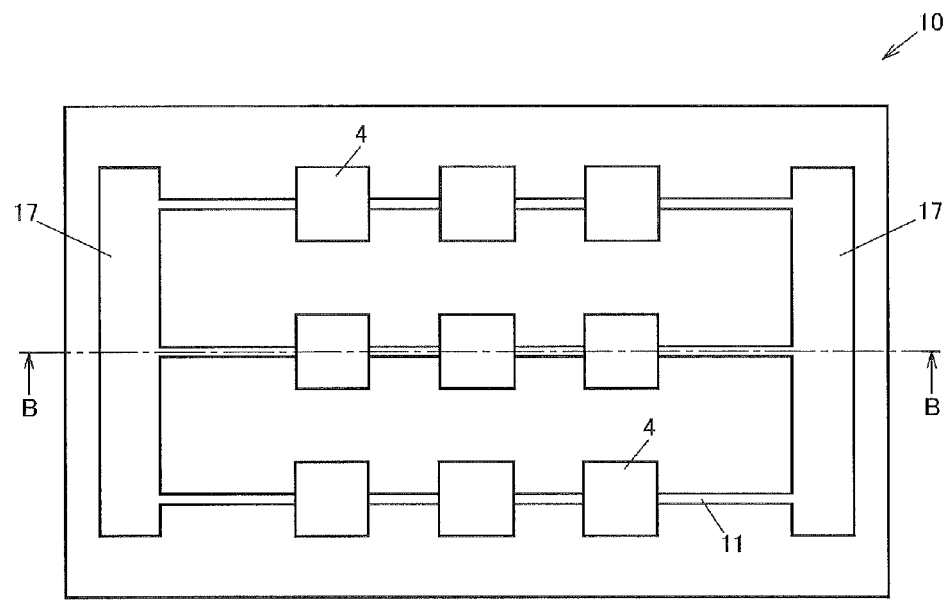
FIGS. 6A and 6B are, respectively, a top view and a cross sectional view showing another structural example of the solid-state device package in the first embodiment.
Figure 6B:
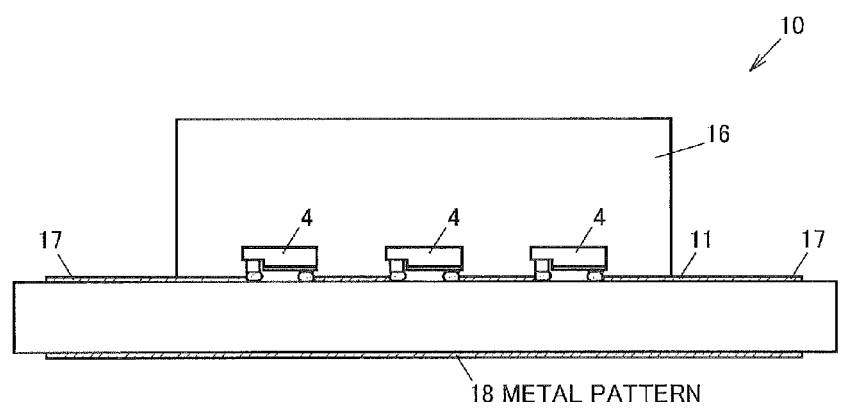

FIGS. 6A and 6B are, respectively, a top view and a cross sectional view showing another structural example of the package of the solid-state device 10. FIG. 6B shows a cross section taken on line B-B of FIG. 6A.

In this configuration, a metal pattern 17 is continuously formed with the metal pattern 11. The metal pattern 17 is exposed without being sealed with the sealing material 16 and is connected to a terminal of an external device. It should be noted that illustration of the sealing material 16 is omitted in FIG. 6A.

In addition, a metal pattern 18 is formed on the back surface of the substrate 2. The metal pattern 18 is a pattern for dissipating heat. In this configuration, since it is not necessary to connect the metal patterns on the front and back surfaces of the substrate 2, it is possible to reduce the manufacturing cost as compared to the configuration shown in FIGS. 5A to 5C.

Second Embodiment

The second embodiment is different from the first embodiment in the shape of the metal pattern and the position of the conductive bump. Note that, the explanation for the same features as the first embodiment will be omitted or simplified.

Figure 7A:
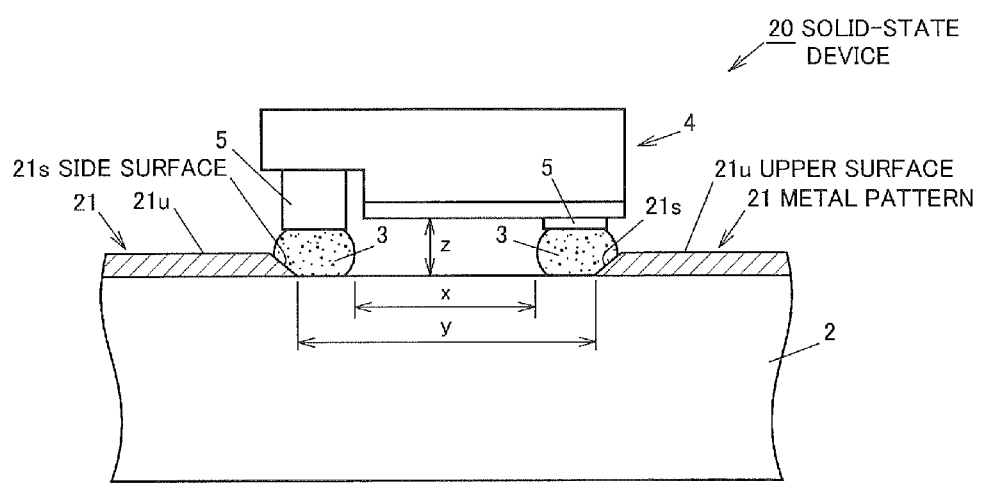
FIG. 7A is a vertical cross-sectional view showing a portion of a solid-state device in a second embodiment and FIG. 7B is a top view showing an end portion of a metal pattern and a conductive hump of the solid-state device in the second embodiment.
Figure 7B:
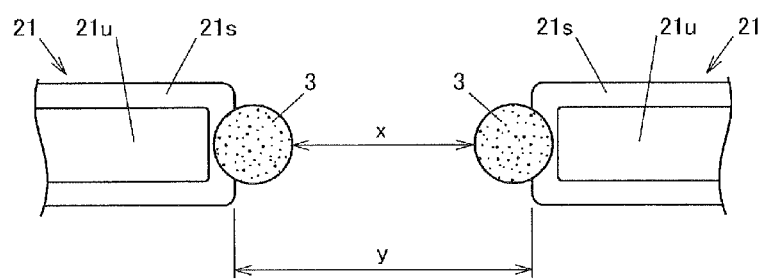

FIG. 7A is a vertical cross-sectional view showing a portion of a solid-state device 20 in the second embodiment FIG. 7B is a top view showing an end portion of a metal pattern 21 and the conductive bump 3 of the solid-state device 20.

A side surface 21s of the metal pattern 21 is inclined with respect to a vertical direction. When the metal pattern 21 is formed by, e.g., screen-printing and baking Ag paste, inclination is naturally formed after the printing. The Ag paste used for the screen-printing contains Ag particles having a diameter of, e.g., not more than 15 μm, and typically 5±2 μm. The thickness of the metal pattern 21 is, e.g., 10 μm.

The conductive bump 3 is formed such that a portion of the bottom surface is in contact with the inclined side surface 21s at the end portion of the metal pattern 21 and another portion is on the substrate 2. Therefore, a portion of the bottom surface of the conductive bump 3 is the same level as a bottom surface of a portion of the metal pattern 21 to which the conductive bump 3 is connected. In addition, it is preferable that the metal pattern 21 be not formed immediately under the horizontal center of the conductive bump 3.

Note that, the conductive bump 3 before mounting the solid-state element 4 does not need to be in contact with the metal pattern 21. In this case, the conductive bump 3 is deformed by mounting the solid-state element 4 and then comes into contact with the side surface 21s of the metal pattern 21.

Figure 8A:
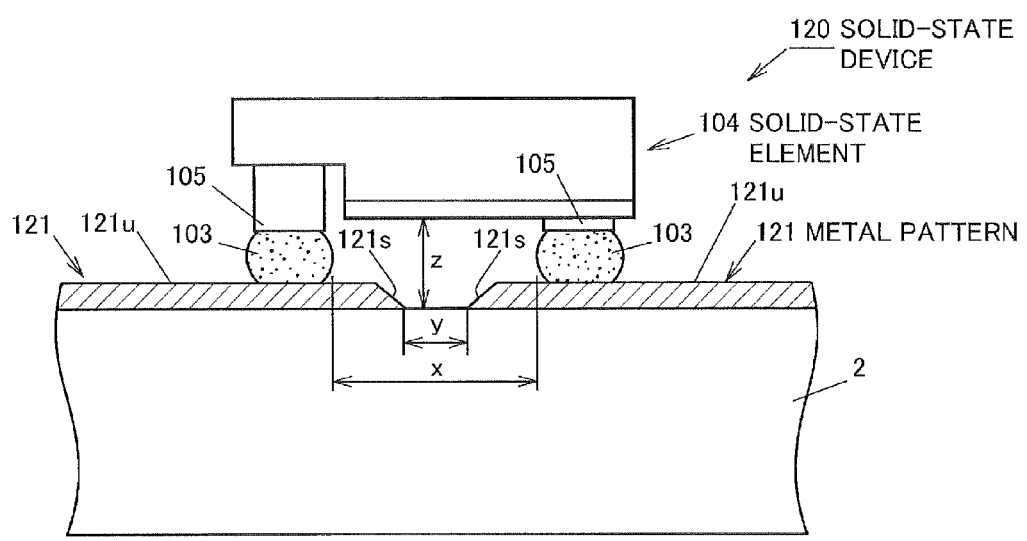
FIG. 8A is a vertical cross-sectional view showing a portion of a solid-state device in Comparative Example and FIG. 8B is a top view showing an end portion of a metal pattern and a conductive bump of the solid-state device in Comparative Example.
Figure 8B:
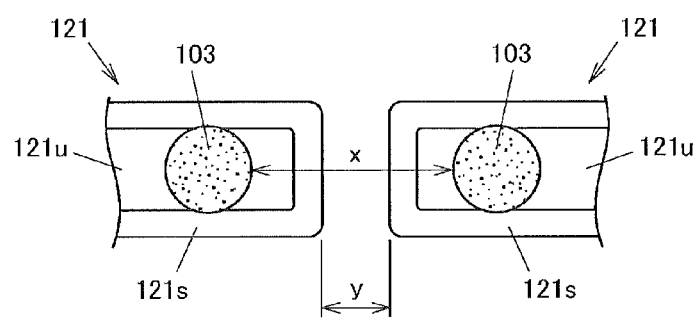

FIG. 8A is a vertical cross-sectional view showing a portion of a solid-state device 120 in Comparative Example. FIG. 8B is a top view showing an end portion of a metal pattern 121 and the conductive bump 103 of the solid-state device 120. In the solid-state device 120, the conductive bump 103 is formed on an upper surface 121u of the metal pattern 121 and the solid-state element 104 is formed thereon.

On the other hand, in the solid-state device 20 of the second embodiment, since the conductive bump 3 is formed such that a portion of the bottom surface is in contact with the inclined side surface 21s of the metal pattern 21 and another portion is on the substrate 2, the distance z from the substrate to the solid-state element is smaller than that in the solid-state device 120. Therefore, the solid-state device 20 in the second embodiment has better heat dissipation than the solid-state device 120 in Comparative Example in the same manner as the first embodiment.

In addition, in the solid-state device 20 of the second embodiment, since the conductive bump 3 is formed such that a portion of the bottom surface is in contact with the inclined side surface 21s of the metal pattern 21 and another portion is on the substrate 2, the space x between the conductive bumps 3 in a region under the solid-state element 4 is smaller than the space y between the metal patterns 21 to which the conductive bumps 3 are connected. On the other hand, in the solid-state device 120 of Comparative Example, the space x between the conductive bumps 103 in a region under the solid-state element 104 is larger than the space y between the metal patterns 121 to which the conductive bumps 103 are connected.

In other words, in the solid-state device 20 of the second embodiment, a distance between the metal patterns can be provided so as to be larger than a distance between the electrodes of the solid-state element in contrast to the solid-state device 120 of Comparative Example. Therefore, it is not necessary to use a highly accurate method for patterning the metal pattern 21 or for inspection after the patterning, which allows the manufacturing cost to be reduced. In addition, it is possible to prevent short-circuit between the metal patterns.

When using a conventional solid-state element in which a distance between electrodes is narrow, it is necessary to use a highly accurate method for forming a thick metal pattern using conductive paste and it is thus not possible to use screen-printing, metal mask printing, discharge using a dispenser or an inkjet method which are low cost but low accuracy. However, according to the second embodiment, it is possible to use these low-cost methods even when using the solid-state element in which a distance between the electrodes is narrow, thereby allowing the manufacturing cost to be reduced. Even when, for example, a diameter of both electrodes of the solid-state element is 100 μm and a distance between the electrodes is 100 μm and also the formation accuracy of the metal pattern is ±50 μm, a distance between the metal patterns corresponding to the electrodes can be designed to be between the centers of the both electrodes of the solid-state element and an allowance of 100 μm which is equivalent to the size of the electrode is created. Also, it is not affected by inclination.

In addition, the area of the metal pattern immediately under the solid-state element in the solid-state device 20 of the second embodiment is smaller than that in solid-state device 120 of Comparative Example. Therefore, in case that the solid-state element 4 is a light-emitting element, an amount of light absorbed by the metal pattern is small and light extraction efficiency is thus high.

Third Embodiment

The third embodiment is different from the second embodiment in the shape of the metal pattern and an inclined angle of the side surface. Note that, the explanation for the same features as the second embodiment will be omitted or simplified.

Figure 9A:
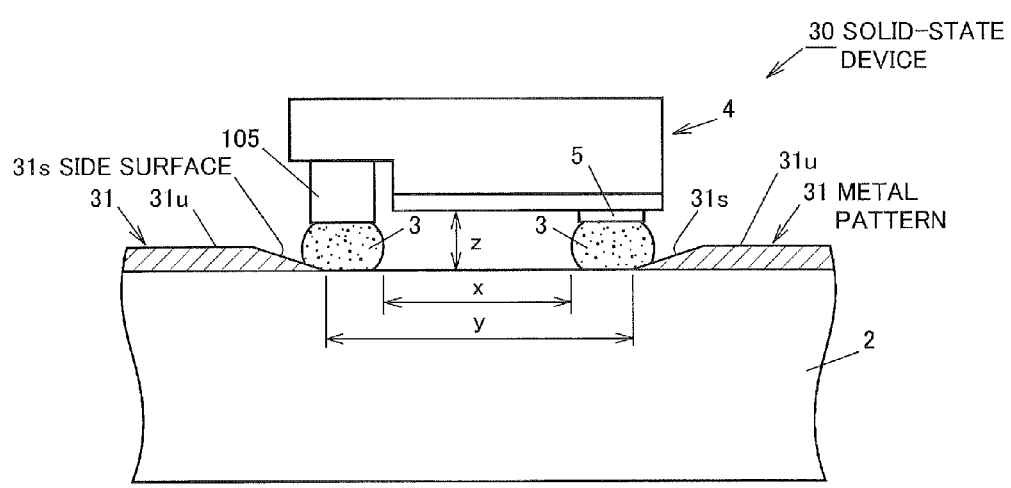
FIG. 9A is a vertical cross-sectional view showing a portion of a solid-state device in a third embodiment and FIG. 9B is a top view showing an end portion of a metal pattern and a conductive bump of the solid-state device in the third embodiment.
Figure 9B:
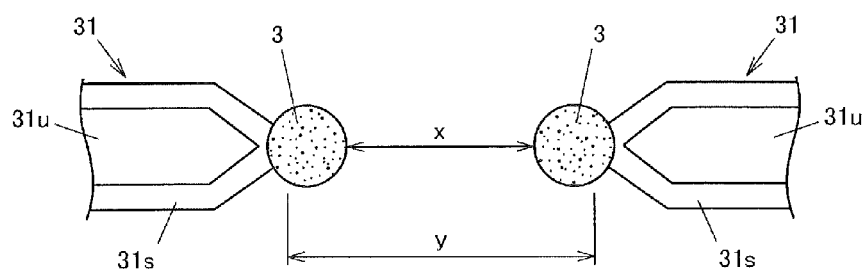

FIG. 9A is a vertical cross-sectional view showing a portion of a solid-state device 30 in the third embodiment. FIG. 9B is a top view showing an end portion of a metal pattern 31 and the conductive bump 3 of the solid-state device 30.

The metal pattern 31 has a pointed triangular shape at an end portion to be connected to the solid-state element 4. In addition, a side surface 31s of the metal pattern 31 is inclined with respect to a vertical direction. When the metal pattern 31 is formed by, e.g., screen-printing Ag paste, the inclination of the side surface 31s is shallower than that of the side surface 21s of the metal pattern 21 in the second embodiment since the end portion of the metal pattern 31 has a triangular shape. This facilitates connection of the conductive bump 3. The conductive bump 3 is formed on the tip of the triangular end portion of the metal pattern 31.

In addition, since the metal pattern 31 has a triangular shape at the end portion to which the solid-state element 4 is connected, the area of the metal pattern 31 immediately under the solid-state element is smaller than that in the metal pattern 21 of the second embodiment. Therefore, in case that the solid-state element 4 is a light-emitting element, an amount of light absorbed by the metal pattern is small and light extraction efficiency is thus high.

The conductive bump 3 is formed such that a portion of the bottom surface is in contact with the inclined side surface 31s at the end portion of the metal pattern 31 and another portion is on the substrate 2. Therefore, a portion of the bottom surface of the conductive bump 3 is the same level as a bottom surface of a portion the metal pattern 31 to which the conductive bump 3 is connected. In addition, it is preferable that the metal pattern 31 be not formed immediately under the horizontal center of the conductive bump 3.

Note that, the conductive bump 3 before mounting the solid-state element 4 does not need to be in contact with the metal pattern 31. In this case, the conductive bump 3 is deformed by mounting the solid-state element 4 and then comes into contact with the side surface 31s of the metal pattern 31.

In addition, in the solid-state device 30, since the conductive bump 3 is formed such that a portion of the bottom surface is in contact with the inclined side surface 31s of the metal pattern 31 and another portion is on the substrate 2, the distance z from the substrate to the solid-state element is smaller than that in the solid-state device 120 of Comparative Example in the same manner as the solid-state device 20 in the second embodiment. Therefore, the solid-state device 30 in the third embodiment has better heat dissipation than the solid-state device 120 in Comparative Example.

In addition, in the solid-state device 30 of the third embodiment, since the conductive bump 3 is formed such that a portion of the bottom surface is in contact with the inclined side surface 31s of the metal pattern 31 and another portion is on the substrate 2, the space x between the conductive bumps 3 in a region under the solid-state element 4 is smaller than the space y between the metal patterns 31 to which the conductive bumps 3 are connected.

In other words, in the solid-state device 30 of the third embodiment, a distance between the metal patterns can be provided so as to be larger than a distance between the electrodes of the solid-state element in contrast to the solid-state device 120 of Comparative Example in the same manner as the solid-state device 20 of the second embodiment.

Fourth Embodiment

The fourth embodiment is different from the first embodiment in that the conductive bump is formed in a hole on the metal pattern. Note that, the explanation for the same features as the first embodiment will be omitted or simplified.

Figure 10A:
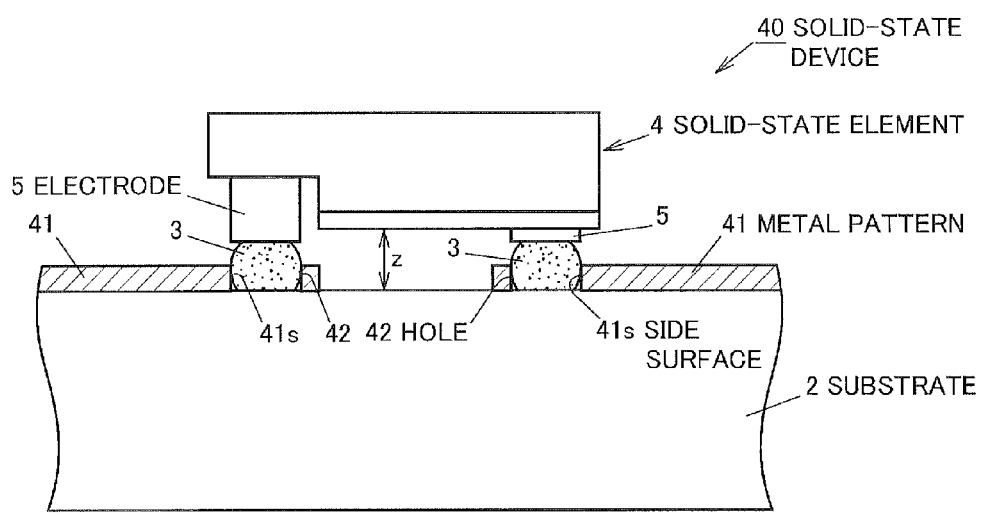
FIG. 10A is a vertical cross-sectional view showing a portion of a solid-state device in a fourth embodiment and FIG. 10B is a top view showing an end portion of a metal pattern and a conductive bump of the solid-state device in the fourth embodiment.
Figure 10B:
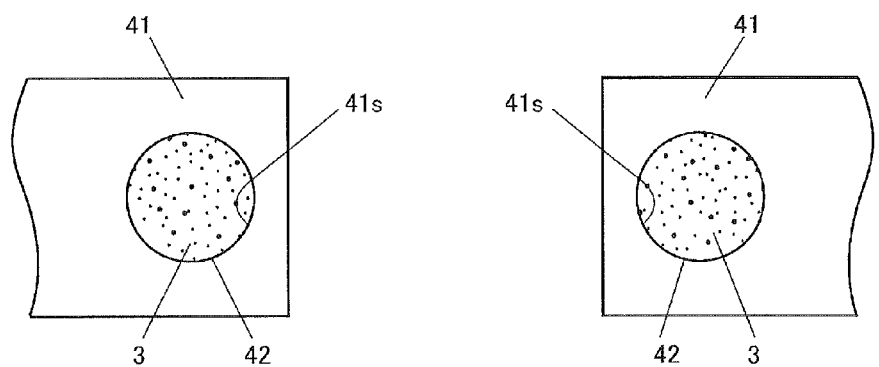

FIG. 10A is a vertical cross-sectional view showing a portion of a solid-state device 40 in the fourth embodiment. FIG. 10B is a top view showing an end portion of a metal pattern 41 and the conductive bump 3 of the solid-state device 40.

At an end portion to be connected to the solid-state element 4, the metal pattern 41 has a hole 42. The conductive bump 3 is formed in the hole 42 and is in contact with a side surface 41s of the metal pattern 41 in the hole 42. Therefore, the bottom surface of the conductive bump 3 is the same level as a bottom surface of a portion of the metal pattern 41 to which the conductive bump 3 is connected. In addition, while the conductive bump 3 may be in contact with an upper surface of the metal pattern 41, the metal pattern 41 is not formed immediately under the horizontal center of the conductive bump 3.

Note that, the conductive bump 3 before mounting the solid-state element 4 does not need to be in contact with the metal pattern 41. In this case, the conductive bump 3 is deformed by mounting the solid-state element 4 and then comes into contact with the side surface 41s of the metal pattern 41.

In the fourth embodiment, since horizontal expansion of the conductive bump 3 is suppressed by the side surface 41s of the metal pattern 41 in the hole 42 at the time of mounting the solid-state element 4, it is possible to relatively easily form the conductive bump 3 with a small diameter. Since this allows the area of the electrode 5 of the solid-state element 4 to be reduced, it is possible to suppress light absorption by the electrode 5 and to improve light extraction efficiency in case that the solid-state element 4 is a light-emitting element.

In addition, in the solid-state device 40, since the conductive bump 3 is formed in the hole 42 of the metal pattern 41, the distance z from the substrate to the solid-state element is smaller than that in the solid-state device 110 of Comparative Example in the same manner as the solid-state device 10 of the first embodiment. Therefore, the solid-state device 40 in the fourth embodiment has better heat dissipation than the solid-state device 110 in Comparative Example.

Fifth Embodiment

The fifth embodiment is different from the first embodiment in that the solid-state element is connected to the metal pattern via three or more conductive bumps. Note that, the explanation for the same features as the first embodiment will be omitted or simplified.

Figure 11:
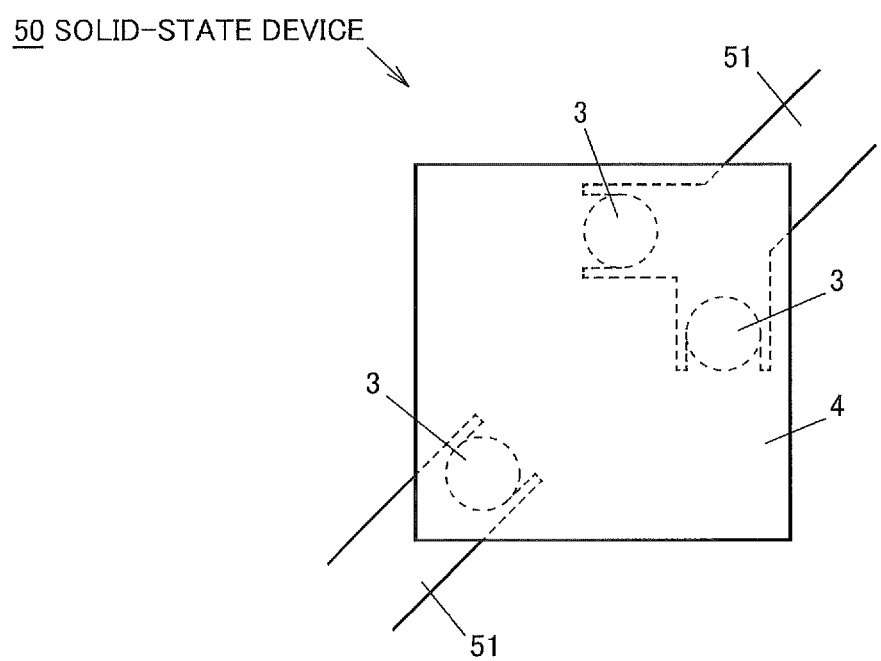
FIG. 11 is a top view showing a portion of a solid-state device in a fifth embodiment.

FIG. 11 is a top view showing a portion of a solid-state device 50 in the fifth embodiment. In the solid-state device 50, the solid-state element 4 is connected to a metal pattern 51 via three conductive bumps 3. Alternatively, the solid-state element 4 may be connected to the metal pattern 51 via four or more conductive bumps 3.

Such a configuration improves operational stability of the solid-state element 4. In addition, since heat dissipation paths from the solid-state element 4 to the substrate 2 increase, hear dissipation of the solid-state element 4 is improved.

The remaining configuration is the same as the first embodiment. In addition, the fifth embodiment can be combined with other embodiments. In other words, the solid-state element 4 may be connected to the metal pattern 21, 31 or 41 via three or more conductive bumps 3 in the solid-state device 20, 30 or 40 of the second, third or fourth embodiment.

Sixth Embodiment

The sixth embodiment is different from the first embodiment in that the solid-state element has an insulating bump. Note that, the explanation for the same feature as the first embodiment will be omitted or simplified.

Figure 12A:
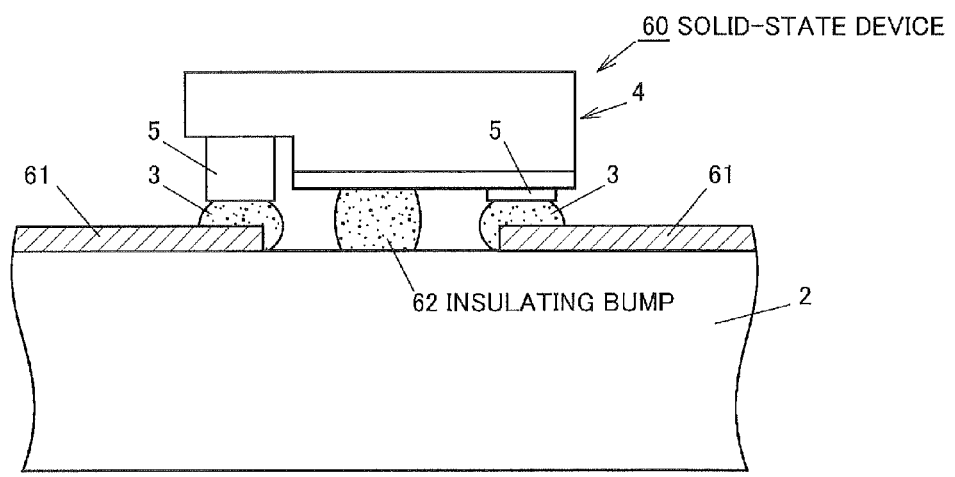
FIG. 12A is a vertical cross-sectional view showing a portion of a solid-state device in a sixth embodiment and FIG. 12B is a top view showing an end portion of a metal pattern and a conductive bump of the solid-state device in the sixth embodiment.
Figure 12B:
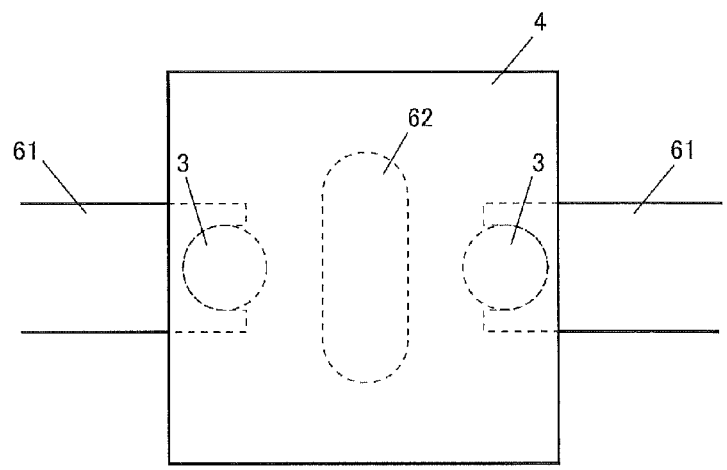

FIG. 12A is a vertical cross-sectional view showing a portion of a solid-state device 60 in the sixth embodiment. FIG. 12B is a top view showing an end portion of a metal pattern 61 and the conductive bump 3 of the solid-state device 60 in the sixth embodiment. The solid-state device 60 has an insulating bump 62. The insulating bump 62 is a bump having insulating properties and is formed so as to be in contact with the solid-state element 4 as well as the substrate 2.

The insulating bump 62 contains insulating particles. It is especially preferable to contain insulating particles having high reflectance, such as $SiO_2$ particles, $Al_2O_3$ particles, ZrO particles or TiO$_2$ particles. In addition, the insulating particles having a higher thermal conductivity are preferable.

The insulating bump 62 releases heat from the solid-state element 4 to the substrate 2, thereby improving heat dissipation of the solid-state device 60. In addition, when the insulating bump 62 is formed in a region between plural conductive bumps 3, short-circuit between the conductive bumps 3 caused by crushing thereof at the time of mounting the solid-state element 4 can be prevented.

The remaining configuration is the same as the first embodiment. In addition, the sixth embodiment can be combined with other embodiments. In other words, the solid-state element 4 may have the insulating bump 62 in the solid-state device 20, 30, 40 or 50 of the second, third, fourth or fifth embodiment.

Seventh Embodiment

The seventh embodiment is different from the first embodiment in the configuration of the solid-state element and the shape of the metal pattern. Note that, the explanation for the same features as the first embodiment will be omitted or simplified.

Figure 13A:
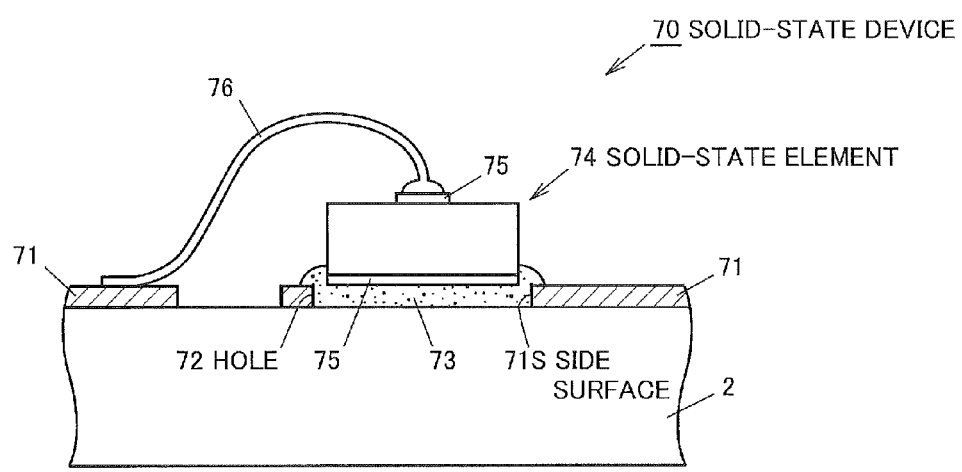
FIG. 13A is a vertical cross-sectional view showing a portion of a solid-state device in a seventh embodiment and FIG. 13B is a top view showing an end portion of a metal pattern and a conductive bump of the solid-state device in the seventh embodiment.
Figure 13B:
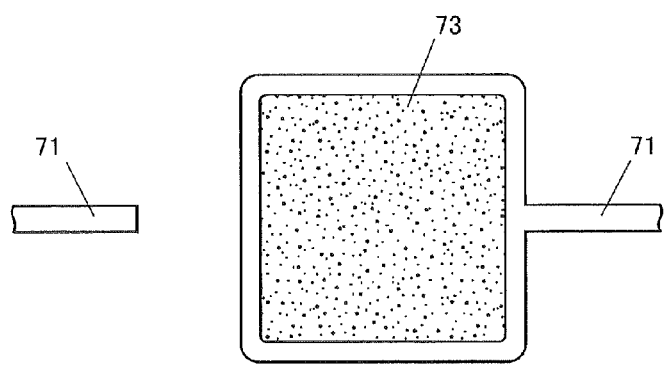

FIG. 13A is a vertical cross-sectional view showing a portion of a solid-state device 70 in the seventh embodiment. FIG. 13B is a top view showing an end portion of a metal pattern 71 and a conductive bump 73 of the solid-state device 70 in the seventh embodiment. The solid-state device 70 has the substrate 2, the metal pattern 71 formed on the substrate 2 and a solid-state element 74 connected to the metal pattern 71 via the conductive bump 73.

One end of the metal pattern 71 (an end on the right side in FIG. 13A) connected to the solid-state element 74 has an annular shape having a hole 72 therein which matches a shape of the bottom surface of the solid-state element 74. The conductive bump 73 is formed in the hole 72 of the annular-shaped portion of the metal pattern 71. Therefore, the bottom surface level of the conductive bump 73 is equal to that of a portion of the metal pattern 71 to which the conductive bump 73 is connected. The conductive bump 73 is in contact with a side surface 71s in the hole 72 of the annular-shaped portion of the metal pattern 71. The metal pattern 71 and the conductive bump 73 can be formed of respectively the same materials as the metal pattern 11 and the conductive bump 3 in the first embodiment.

The solid-state element 74 is a face-up-type element and is formed by, e.g., epitaxially growing n- and p-type GaN on an n-type GaN substrate. Note that, a substrate material or a crystal grown on the substrate is not limited to GaN and it is possible to use a compound semiconductor based on GaAs, AlInGa or SiC, etc., or a crystal of a single-element semiconductor such as Si. In addition, the substrate of the solid-state element 74 only needs to be a conductive substrate.

Electrodes 75 are formed on bottom and upper surfaces of the solid-state element 74 so that the electrode 75 on the bottom surface is connected to the metal pattern 71 via the conductive bump 73 and the electrode 75 on the upper surface is connected to the metal pattern 71 via a wire 76. Since the solid-state element 74 is placed in the region inside the annular-shaped portion of the metal pattern 71, the metal pattern 71 is not present in a region immediately under the solid-state element 74.

In the solid-state device 70 of the seventh embodiment, the bottom surface level of the conductive bump 73 is equal to that of a portion of the metal pattern 71 to which the conductive bump 73 is connected and it is possible to reduce the distance from the substrate to the solid-state element as compared to the case of forming the conductive bump on the metal pattern. Therefore, the solid-state device 70 has excellent heat dissipation.

Although the end portion of the metal pattern 71 on a side connected to the conductive bump 73 has an annular shape so that the conductive bump 73 is less likely to separate from the substrate 2, the shape does not need to be annular when the conductive bump 73 has enough bonding strength.

Eighth Embodiment

The eighth embodiment is different from the that embodiment in that a metal island is formed under an anode electrode of the solid-state element. Note that, the explanation for the same features as the first embodiment will be omitted or simplified.

Figure 14A:
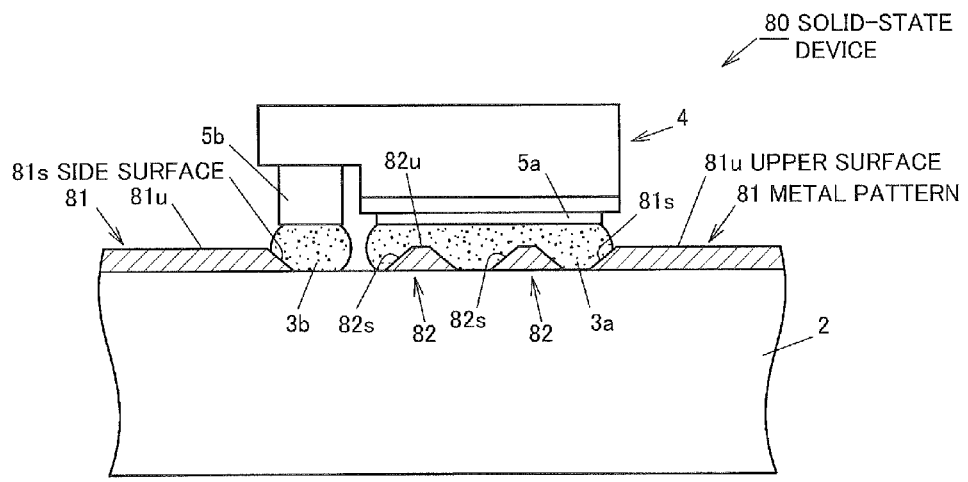
FIG. 14A is a vertical cross-sectional view showing a portion of a solid-state device in an eighth embodiment and FIG. 14B is a top view showing a configuration of a metal pattern and a metal island of the solid-state device in a region under a solid-state element.
Figure 14B:
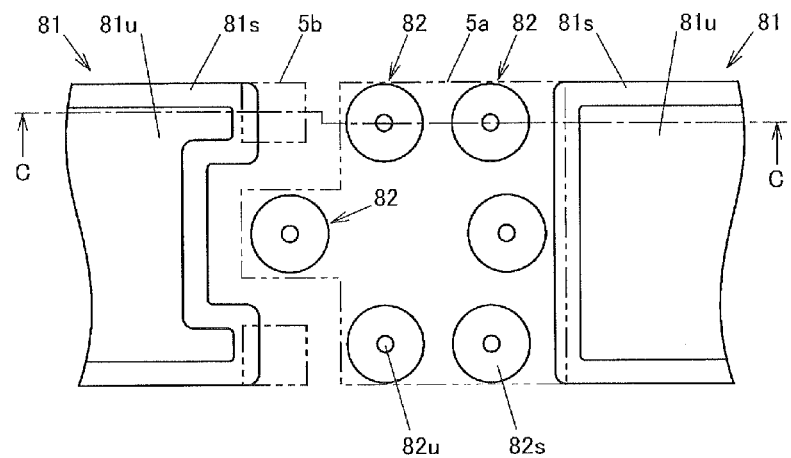

FIG. 14A is a vertical cross-sectional view showing a portion of a solid-state device 80 in the eighth embodiment. FIG. 14B is a top view showing a configuration of a metal pattern 81 and a metal island 82 of the solid-state device 80 in a region under the solid-state element 4, FIG. 14A shows a cross section taken on line C-C of FIG. 14B. It should be noted that the two-dot chain line in FIG. 14B indicates positions of electrodes 5a and 5b of the solid-state element 4.

The electrode 5a of the solid-state element 4 is directly or indirectly connected to a lower cladding layer (on the substrate 2 side) of a non-illustrated light-emitting layer and functions as an anode electrode. It is preferable that the electrode 5a have an area similar to an area of the cladding layer. The electrode 5b is connected to an upper cladding layer of the light-emitting layer and functions as a cathode electrode. The electrodes 5a and 5b axe connected to the metal pattern 81 respectively via conductive bumps 3a and 3b.

The conductive bumps 3a and 3b are in contact with a side surface 81s of the metal pattern 81. In addition, the bottom surface level of the conductive bumps 3a and 3b is equal to that of a portion of the metal pattern 81 to which the conductive bumps 3a and 3b are connected.

The metal islands 82 are formed on the substrate 2 under the electrode 5a. The metal pattern 81 and the metal island 82 can be formed by screen-printing, deposition, sputtering or plating. In this case, the level of an upper surface 81u of the metal pattern 81 is equal to the level of an upper surface 82u of the metal island 82. Here, the side surface 81s of the metal pattern 81 and a side surface 82s of the metal island 82 may be vertical or inclined with respect to a vertical direction.

The surface of the metal island 82 is covered by the conductive bump 3a. By such a configuration, thinning of the conductive bump 3a caused by crushing of an end portion or the entire portion thereof can be suppressed. If a thin portion is formed in the conductive bump 3a, the stress relaxation effect by the conductive bump 3a, which is formed of a softer metal material than a ceramic material, is deteriorated and the solid-state element 4 may be separated from the substrate 2 due to a difference in thermal expansion coefficient between the solid-state element 4 and the substrate 2. In addition, if an end of the conductive bump 3a is crushed, the solid-state element 4 is inclined and the distance between the solid-state element 4 and the substrate 2 becomes uneven, which causes a bias in the temperature distribution of the solid-state element 4. In other words, the metal island 82 can suppress the separation of the solid-state element 4 from the substrate 2 or the bias in the temperature distribution in the solid-state element 4.

When a horizontal size of the solid-state element 4 is not less than 1.0 mm square, heat dissipation thereof is less than the standard LED chip size of 0.3 mm square. Therefore, temperature is likely to rise even if current density is the same and it is also likely to be affected by stress generated due to a difference in thermal expansion coefficient since a length of each side is longer. The separation of the solid-state element 4 from the substrate 2 caused by crushing of the conductive bump 3a is particularly likely to occur when, e.g., the horizontal size of the solid-state element 4 is not less than 1.0 mm square as well as when a difference in thermal expansion coefficient between the solid-state element 4 and the substrate 2 is not less than $2 \times 10^{-6}/°$ C., and the eighth embodiment is particularly effective in such a case.

The thermal expansion coefficient of the solid-state element 4 is about $7 \times 10^{-6}/°$ C. when the solid-state element 4 is, e.g., a GaN-based LED formed on a sapphire substrate and the thermal expansion coefficient of the substrate 2 is about $5 \times 110^{-6}/°$ C. when the substrate 2 is an AlN substrate, hence, the difference therebetween is $2 \times 10^{-6}/°$ C.

The number of the metal islands 82 is not limited and may be one, however, it is possible to further improve stability of the solid-state element 4 when three or more metal islands 82 are arranged so as not to form a straight line.

Ninth Embodiment

The ninth embodiment is different from the first embodiment in that a cut-out is formed on the metal pattern in a region under the anode electrode of the solid-state element. Note that, the explanation for the same features as the first embodiment will be omitted or simplified.

Figure 15A:
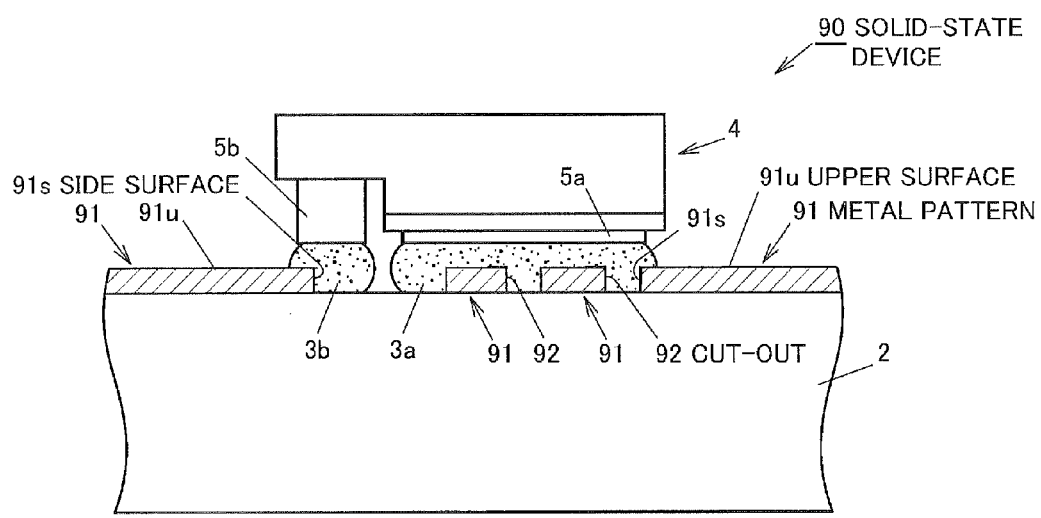
FIG. 15A is a vertical cross-sectional view showing a portion of a solid-state device in a ninth embodiment and FIG. 15B is a top view showing a configuration of a metal pattern of the solid-state device in a region under a solid-state element.
Figure 15B:
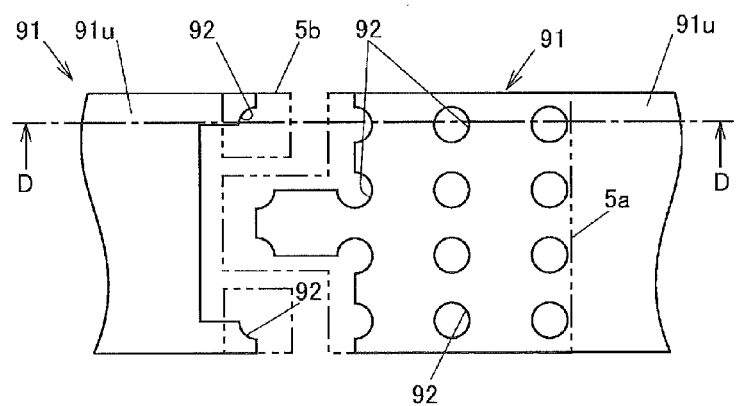

FIG. 15A is a vertical cross-sectional view showing a portion of a solid-state device 90 in the ninth embodiment. FIG. 15B is a top view showing a configuration of a metal pattern 91 of the solid-state device 90 in a region under the solid-state element 4. FIG. 15A shows a cross section taken on line D-D of FIG. 15B. It should be noted that the two-dot chain line in FIG. 15B indicates positions of electrodes 5a and 5b of the solid-state element 4.

The electrode 5a of the solid-state element 4 is directly or indirectly connected to a lower cladding layer (on the substrate 2 side) of a non-illustrated light-emitting layer and functions as an anode electrode. It is preferable that the electrode 5a have an area similar to an area of the cladding layer. The electrode 5b is connected to an upper cladding layer of the light-emitting layer and functions as a cathode electrode. The electrodes 5a and 5b are connected to the metal pattern 91 respectively via the conductive bumps 3a and 3b.

The conductive bumps 3a and 3b are in contact with a side surface 91s of the metal pattern 91. In addition, the bottom surface level of the conductive bumps 3a and 3b is equal to that of a portion of the metal pattern 91 to which the conductive bumps 3a and 3b are connected.

Cut-outs 92 are formed on the metal pattern 91 in a region under the electrode 5a. The cut-outs 92 on the inner side of the metal pattern 91 are holes and the cut-outs 92 at a rim are notches. When forming the metal pattern 91, the cut-outs 92 can be simultaneously formed as a portion of the shape of the metal pattern 91. Note that, the side surface 91s of the metal pattern 91 (including a side surface of the cut-outs 92) may be vertical or inclined with respect to a vertical direction.

The conductive bump 3a is formed in a region of the metal pattern 91 including the cut-outs 92. By the configuration in which the region of the metal pattern 91 including the cut-outs 92 is formed on the substrate 2 under the electrode 5a, the thinning of the conductive bump 3a caused by crushing of the end portion or the entire portion thereof can be suppressed. In other words, the region of the metal pattern 91 including the cut-outs 92 can suppress the separation of the solid-state element 4 from the substrate 2 or the bias in the temperature distribution in the solid-state element 4 in the same manner as the metal island 82 of the eighth embodiment.

The separation of the solid-state element 4 from the substrate 2 caused by crushing of the conductive bump 3a is particularly likely to occur when, e.g., the horizontal size of the solid-state element 4 is not less than 1 mm square as well as when a difference in thermal expansion coefficient between the solid-state element 4 and the substrate 2 is not less than $2 \times 10^{-6}/°$ C., and the ninth embodiment is particularly effective in such a case.

In addition, on the metal pattern 91 connected to the electrode 5a, the cut-out 92 as a notch is formed at a rim on the electrode 5b side, and accordingly, expansion of the conductive bump 3a toward the conductive bump 3b is suppressed by the volume of the notched portion in which the metal pattern 91 is not present and it is thus possible to prevent short-circuit.

It is possible to control the distance z from the substrate 2 to the solid-state element 4 by adjusting the amount and layout, etc., of the conductive bump 3a in accordance with the total area of the cut-outs 92. Therefore, the number and size of the cut-outs 92 are not limited.

The cut-outs 92 may be formed also in a region under the electrode 5b. In this case, the conductive bump 3b is formed in a region of the metal pattern 91 including the cut-outs 92 under the electrode 5b.

Tenth Embodiment

The tenth embodiment is different from the first embodiment in that the solid-state element is a power transistor. Note that, the explanation for the same feature as the first embodiment will be omitted or simplified.

Figure 16A:
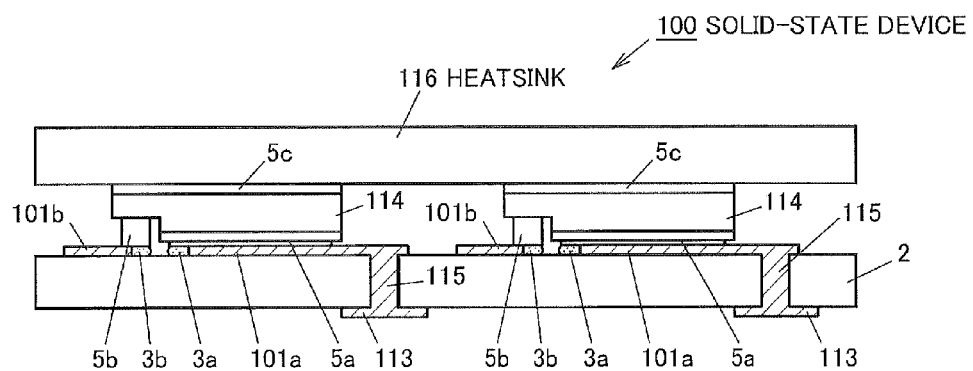
FIG. 16A is a vertical cross-sectional view showing a portion of a solid-state device in a tenth embodiment and FIG. 16B is a top view showing a configuration of a metal pattern of the solid-state device.
Figure 16B:
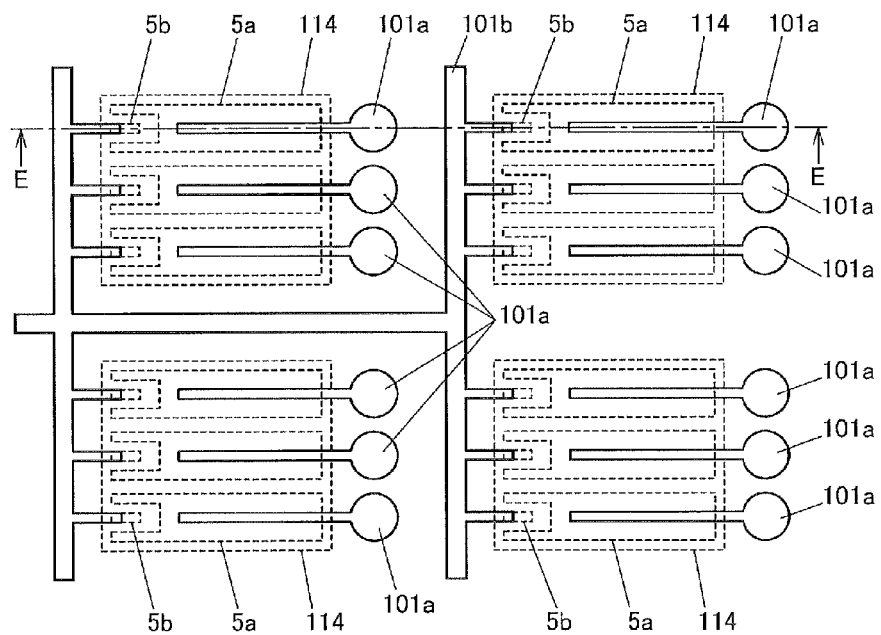

FIG. 16A is a vertical cross-sectional view showing a portion of a solid-state device 100 in the tenth embodiment. FIG. 16B is a top view showing a configuration of metal patterns 101a and 101b of the solid-state device 100. FIG. 16A shows a cross section taken on line E-E of FIG. 16B. It should be noted that the two-dot chain line in FIG. 16B indicates positions of the solid-state elements 4 and positions of electrodes 5a and 5b of the solid-state elements 4.

A solid-state element 114 is a vertical power transistor having the electrode 5a as a source electrode and a electrode 5c as a drain electrode on lower and upper surfaces, and is, e.g., a GaN-based transistor formed on a conductive chipboard such as GaN substrate. The electrode 5b of the solid-state element 114 functions as a gate electrode.

In the metal pattern of the solid-state device 100, a portion connected to the electrode 5a is defined as the metal pattern 101a and a portion connected to the electrode 5b is defined as the metal pattern 101b. The electrodes 5a and 5b are respectively connected to the metal patterns 101a and 101b via the conductive bumps 3a and 3b. The metal pattern 101a is connected to a metal pattern 113 on the back side of the substrate 2 through a via 115.

The conductive bumps 3a and 3b are in contact with side surfaces of the metal patterns 101a and 101b. In addition, the bottom surface level of the conductive bumps 3a and 3b is equal to that of a portion of the metal patterns 101a and 101b to which the conductive bumps 3a and 3b are connected.

In addition, a heatsink 116 for dissipating heat of the solid-state element 114 is formed on the solid-state element 114 so as to be in contact with the electrode 5c. The heatsink 116 also functions as a ground electrode and is adhered to the electrode 5c by a conductive adhesive. The heatsink 116 is formed of a material having, e.g., a thermal conductivity of not less than 100 W/(m·c) and linear thermal expansion coefficient of not more than 16 ppm/° C., preferably less than 10 ppm/° C., such as Cu, CuMo, CuW or AlSiC.

As an adhesive for bonding the heatsink 116 to the electrode 5c, it is possible to use the same conductive material as the conductive bumps 3a and 3b.

The metal pattern 101a is composed of plural linear metal films at least in a region under the electrode 5a. The plural linear metal films are preferably arranged in substantially parallel. By configuring the metal pattern 101a as such, inclination of the solid-state element 114 is suppressed and it is possible to suppress a phenomenon such that the solid-state element 114 does not adhere to the heatsink 116 or thickness unevenness occurs in the adhesive for bonding the heatsink 116 to the electrode 5c. The electrode 5a may be in contact with the upper surface of the metal pattern 101a. In this case, the inclination of the solid-state element 114 is suppressed more effectively.

Figure 17A:
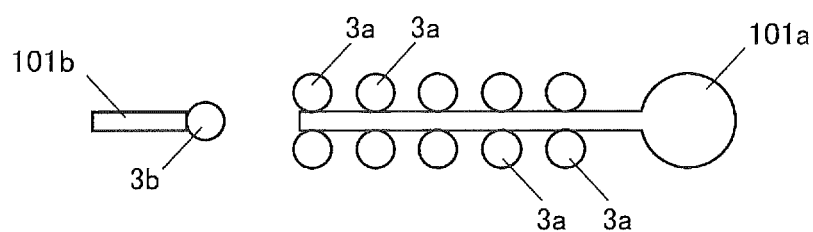
FIGS. 17A and 17B are top views showing examples of arrangement of conductive bumps in the tenth embodiment.
Figure 17B:
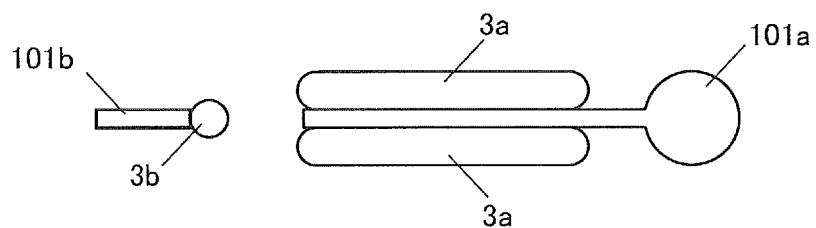

FIGS. 17A and 17B are top views showing examples of arrangement of the conductive bump 3a. The conductive bumps 3a may be placed in a dotted manner as shown in FIG. 17A or in a linear manner as shown in FIG. 17B. The conductive bumps 3a and 3b are formed by, e.g., discharge using a dispenser or screen-printing.

Meanwhile, the metal pattern 101b may be also composed of plural linear metal films arranged in parallel. Furthermore, the electrodes 5a and 5b may be also formed of plural metal films. In this case, as shown in FIG. 16B, the number of the metal patterns 101a and 101b is equal to that of the electrodes 5a and 5b and a pair of the metal patterns 101a and 101b is connected to a pair of the electrodes 5a and 5b. Such a configuration allows the solid-state element 114 to provide uniform current.

It should be noted that the present invention is not intended to be limited to the above-mentioned embodiments, and the various kinds of modifications can be implemented without departing from the gist of the invention. In addition, any combinations of the constituent elements in the above-mentioned embodiments can be made without departing from the gist of the invention.

In addition, the invention according to claims is not to be limited to the above-mentioned embodiments. Further, it should be noted that all combinations of the features described in the embodiments are not necessary to solve the problem of the invention.

What is claimed is:

1. A solid-state device, comprising:
a substrate comprising a metal pattern formed thereon;
a solid-state element mounted on the substrate and comprising an electrode; and
a conductive bump in contact with the metal pattern of the substrate and the electrode of the solid-state element,
wherein, in a top view, a contact area of the conductive bump and the electrode comprises a region other than a contact area of the conductive bump and the metal pattern,
wherein, in a plane that includes center lines of opposite-conductivity ones of the conductive bump, a shortest distance between opposite edges of opposite-conductivity ones of the metal pattern is not less than a shortest distance between the center lines of the opposite-conductivity ones of the conductive bump, and
wherein, in the top view, an entirety of a top surface of the metal pattern is located outside the conductive bump.

2. A solid-state device, comprising:
a metal pattern formed on a substrate;
a conductive bump connected to the metal pattern; and
a solid-state element connected to the metal pattern via the conductive bump,
wherein the solid-state element comprises a plurality of electrodes,
wherein a bottom surface level of at least a portion of the conductive bump is substantially equal to a bottom surface level of a portion of the metal pattern at which the metal pattern is connected to the conductive bump,
wherein the conductive bump is in contact with the substrate, a side surface of the metal pattern, and the electrodes of the solid-state element,
wherein X<Y is satisfied where X represents a contact area between the conductive bump and a top surface of the metal pattern, and Y represents a contact area between the conductive bump and the substrate,
wherein a center part of the conductive bump is not in contact with the top surface of the metal pattern as an electrical terminal, and
wherein, in a plan view, an entirety of the top surface of the metal pattern is located outside the conductive bump.

3. The solid-state device according to claim 2, wherein the side surface of the metal pattern is inclined with respect to a vertical direction.

4. The solid-state device according to claim 2, wherein the conductive bump comprises a plurality of conductive bumps and the metal pattern comprises a plurality of metal patterns, and
wherein, in a region under the solid-state element, a distance between the conductive bumps is smaller than a distance between the metal patterns connected to the conductive bumps.

5. The solid-state device according to claim 2, wherein the metal pattern comprises first and second metal patterns, wherein the conductive bump comprises first and second conductive bumps, and
wherein two electrodes of the solid-state element are each connected to the first and second metal patterns via the first and second conductive bumps.

* * * * *